(12) United States Patent
Nin

(10) Patent No.: US 8,546,946 B2
(45) Date of Patent: Oct. 1, 2013

(54) CHIP STACK PACKAGE HAVING SPIRAL INTERCONNECTION STRANDS

(75) Inventor: Shu-Liang Nin, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 292 days.

(21) Appl. No.: 13/090,281

(22) Filed: Apr. 20, 2011

(65) Prior Publication Data

US 2012/0267776 A1    Oct. 25, 2012

(51) Int. Cl.
*H01L 23/48* (2006.01)

(52) U.S. Cl.
USPC .......................... 257/758; 257/777; 257/686

(58) Field of Classification Search
USPC ................................. 257/686, 758

IPC .............................................. H01L 24/33,23/52
See application file for complete search history.

(56) References Cited

U.S. PATENT DOCUMENTS

2006/0267212 A1* 11/2006 Shibata et al. ................ 257/777

* cited by examiner

*Primary Examiner* — Eva Yan Montalvo
(74) *Attorney, Agent, or Firm* — Winston Hsu; Scott Margo

(57) ABSTRACT

A chip stack package is provided. The chip stack package includes an n number of chips stacked on each other and an n number of interconnection strands connecting the chips. The interconnection strands are spirally rotated and insulated from each other. In one embodiment, the chips are substantially structurally identical. In another embodiment, each of the interconnection strands is electrically coupled to a chip selection signal.

14 Claims, 11 Drawing Sheets

CHIP STACK PACKAGE HAVING SPIRAL INTERCONNECTION STRANDS

BACKGROUND OF THE INVENTION

1. Field of the Invention

The present invention relates to a chip stack package, and more particularly, to a chip stack package having a DNA-like interconnection structure between the packaged chips. The DNA-like interconnection structure comprises spiral, electrical interconnection strands constructed by metal layers in or on each chip and the through silicon vias (TSVs) for the connection between chips.

2. Description of the Prior Art

Packaging technologies for a semiconductor integrated device have been continuously developed to satisfy the demands for miniaturization and mounting efficiency. As the miniaturization and high performance are required in the recent development trends of the electronic appliance, various semiconductor stacking technologies have been developed. When applying the stack technology in the field of memory devices, it is possible to realize a packaged product having the memory capacity more than two times the memory capacity of an unpackaged chip, and thus it is possible to increase the efficiency of the mounting area usage.

In the recent years, a chip stack package having through silicon via (TSV) structure has been proposed due to its convenient property for connecting chips. FIG. 1 illustrates a conventional chip stack package having TSVs. As shown in FIG. 1, briefly, a TSV 102 is formed by forming a hole in each chip 104 and filling the hole with conductive material. The TSVs 102a, 102b, 102c, 102d create a short electrical connection path between the chips 104a, 104b, 104c, and 104d. Compared with conventional wire bonding packages, there is no need to further include additional areas on the substrate for wire bonding, thus both the size and the height of the chip stack package 100 can be reduced.

However, the selection between the chips 104 in the prior art chip stack package 100 is problematic. For example, if one wants to select the chip 104a to drive the chip 104a to be operated by an input/output signal in the subsequent step, an individual chip selection signal is required and should be transmitted to the chip 104a in the beginning. However, since the TSVs 102a, 102b, 102c, 102d are all connected together, there is no independent route specific for the chip 104a. When the substrate 106 provides a chip selection signal to the TSV 102a, 102b, 102c, 102d, all the chips 104a, 104b, 104c, 104d would receive the same signal. Therefore, it is difficult to select the chip 104a by using the TSVs 102 in the conventional chip stack package 100. Some researchers have overcome the problem by marking an individual ID on each chip 102 during the wafer stage so as to enable the chip selection function. However, this method is relatively complex, time-consuming and thus not economical. In light of the above, there is still a need to have a chip stack package capable of transmitting chip selection signals independently, without the need of marking an individual ID on each chip during the wafer stage.

SUMMARY OF THE INVENTION

The present invention therefore provides a chip stack package with TSV in which spiral interconnection strands are disposed for transmitting chip selection signals.

According to one embodiment of the present invention, a chip stack package is provided. The chip stack package comprises an n number of chips stacked on each other and an n number of interconnection strands connecting the chips. The interconnection strands are spirally rotated and insulated from each other. In one embodiment, the chips are substantially structurally identical. In another embodiment, each of the interconnection strands is electrically coupled to a chip selection signal.

According to another embodiment of the present invention, a chip stack package is provided. The chip stack package includes a DNA-like interconnection structure between a plurality of packaged chips, wherein the DNA-like interconnection structure comprises spiral, electrical interconnection strands constructed by metal layers in or on each chip and the TSVs for the connection between the chips.

Due to the DNA-like structure of the spiral interconnection strands, the chip selection signal for each chip can be transmitted independently. The space of the chip can be saved and the design on the chip stack package can be more flexible.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements. It is noted that the term "vertical" refers to a direction perpendicular to conventional plane such as the top surface of a substrate. Prepositions, such as "on", "over", "above", "upper", "lower", "bottom" or "top" are defined with respect to the conventional plan, regardless of the orientation of the substrate. Therefore, the following detailed description is not to be taken in a limiting sense.

Figure 1:
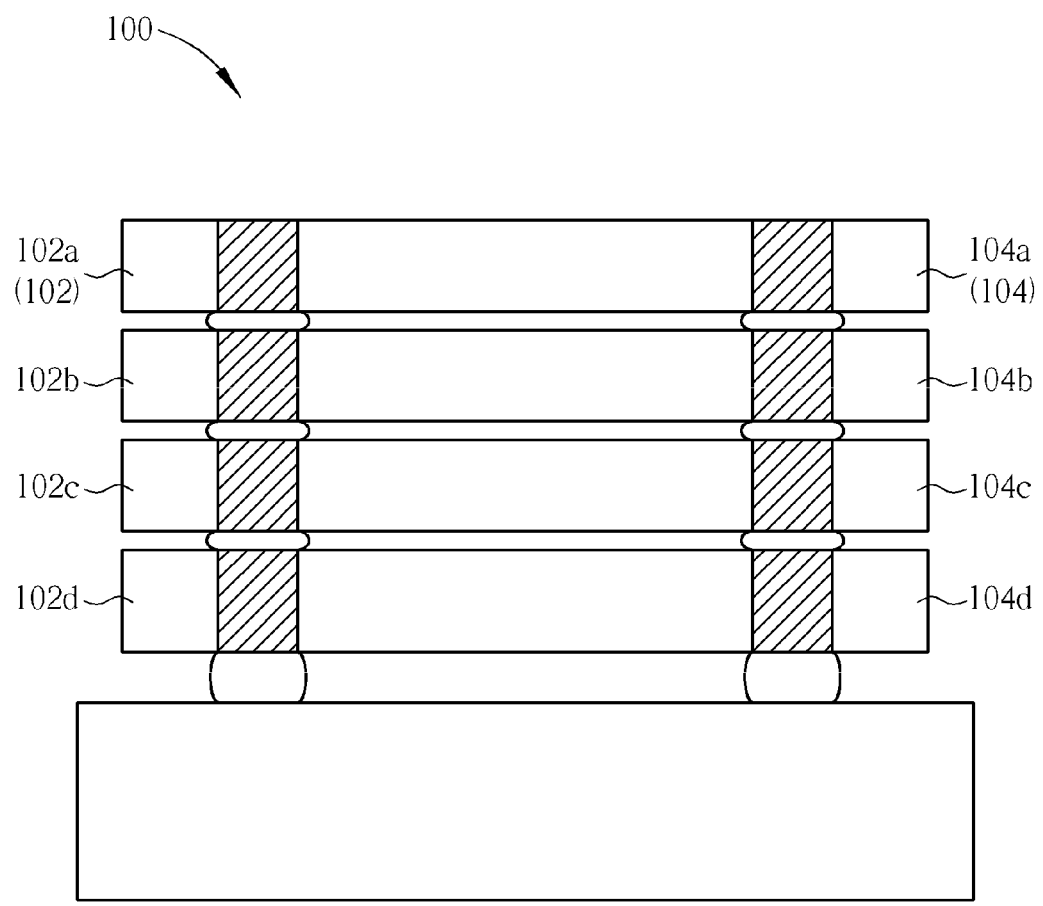
FIG. 1 illustrates a schematic diagram of the chip stack package having TSVs in conventional arts.
Figure 2:
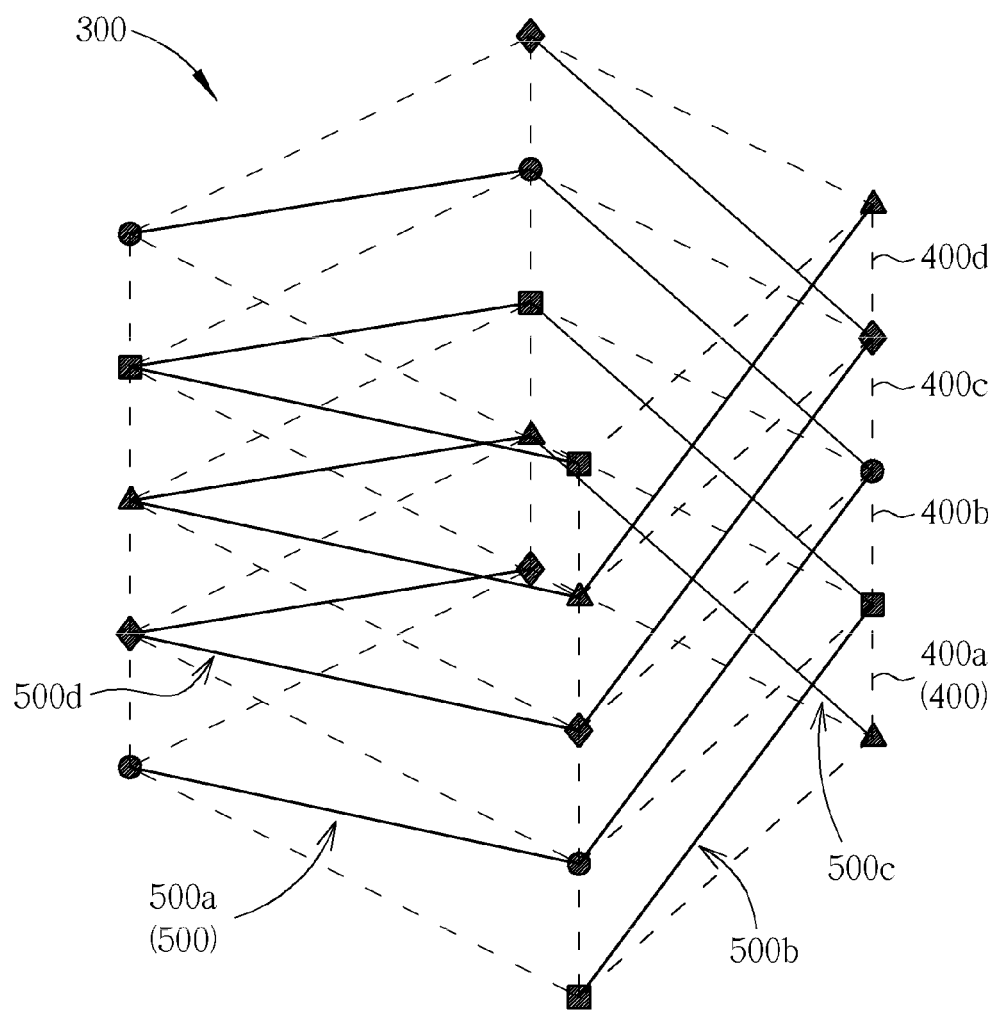
FIG. 2 illustrates a schematic diagram of the chip stack package in the present invention.

FIG. 2 is a schematic diagram showing an exemplary chip stack package according to one embodiment of the present invention. As shown in FIG. 2, the exemplary chip package 300 includes four chips 400a, 400b, 400c and 400d and four interconnection strands 500a, 500b, 500c and 500d, which are used for connecting and transmitting signals for the chips 400. The spiral interconnection strands 500a, 500b, 500c, 500d form a DNA-like interconnection structure between the packaged chips 400a, 400b, 400c, 400d. That is, the interconnection strands 500a, 500b, 500c and 500d are spirally rotated with each other and are insulated from each other. The term "spirally" in the present invention refers to a helix structure which has a three-dimensional curve that turns around an axis at a constant or continuously varying distance while moving parallel to the axis. As shown, the interconnection strand 500 is rotated upwardly and returns to a position corresponding to the starting point in a vertical direction after a cycle of rotation. In one preferred embodiment, the interconnection strand 500 is used for transmitting chip selection signals. That is, for each interconnection strand 500, one chip selection signal can be transmitted for one specific chip 400 to select this chip 400. Thus, the selected chip can be subsequently driven by other input/output signals (not shown). Because of DNA-like structure of the interconnection strands 500 which are spirally rotated with each other, the chip selection signal for each chip 400 can be transmitted separately without interference with each other and the space for placing the chip selection circuit can be saved. Consequently, the design on the chip stack package 300 can be more flexible.

Figure 3:
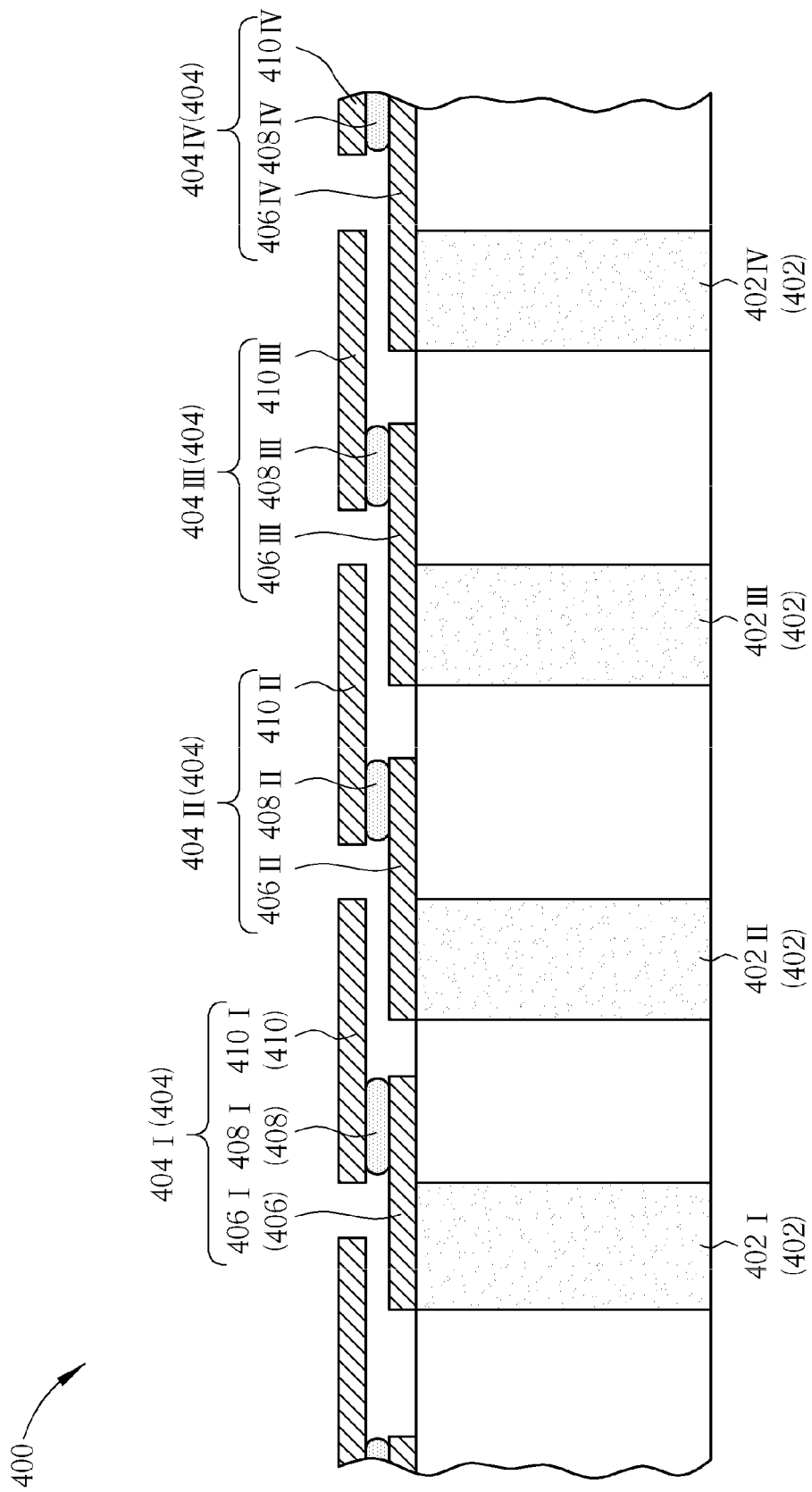
FIG. 3 to FIG. 5 illustrate schematic diagrams of the chip stack package in accordance with the first embodiment in the present invention.

In the present invention, the DNA-like interconnection structure including spiral, electrical interconnection strands 500 are constructed by metal layers in or on each chip 400 and TSVs between the chips 400. For the detailed description, please refer to FIG. 3 to FIG. 5, which illustrate schematic diagrams of the chip stack package in accordance with the first embodiment in the present invention. As shown in FIG. 3, the chip 400 includes four TSVs 402I, 402II, 402III, 402IV, and four wiring units 404I, 404II, 404III, 404IV. Each TSV 402 penetrates through the chip 400 from one surface to another and is electrically connected to each wiring unit 404, respectively. In the present embodiment, the wiring unit 404 is a redistribution layer (RDL) disposed on a surface above the chip 400, and each wiring unit 404 includes a bottom layer 406, an interconnection unit 408 and a top layer 410. The bottom layer 406 and the top layer 410, for example, may be two individual metal layers such as copper foils. Each bottom layer 406 is connected to each top layer 410 by the interconnection unit 408, such as a solder bump in the present embodiment. In another embodiment, the bottom layer 406 can be directly connected to the top layer 410 without using the interconnection unit 408. The TSV 402 is connected to the bottom layer 406 of the wiring unit 404.

It is noted that the wiring unit 404 in the present invention is connected to one TSV and is further extending to another TSV which is juxtaposed next to the preceding TSV. For example, the wiring unit 404I is connected to the TSV 402I and extends to the space above the TSV 402II but does not contact the TSV 402II by arranging the layout of the two separated metal layers, namely the bottom layer 406I and the top layer 410I. The upper layer 410I of the wiring unit 404I overlaps the bottom layer 406II of the wiring unit 404II in the vertical direction. Moreover, as shown in the right part of FIG. 3, the wiring unit 404IV is connected to the TSV 402IV and further extends above the TSV 402I wherein the layout arrangement of the wiring unit 404IV should be understood in a 3D viewpoint which will be described in the following contexts.

Figure 4:
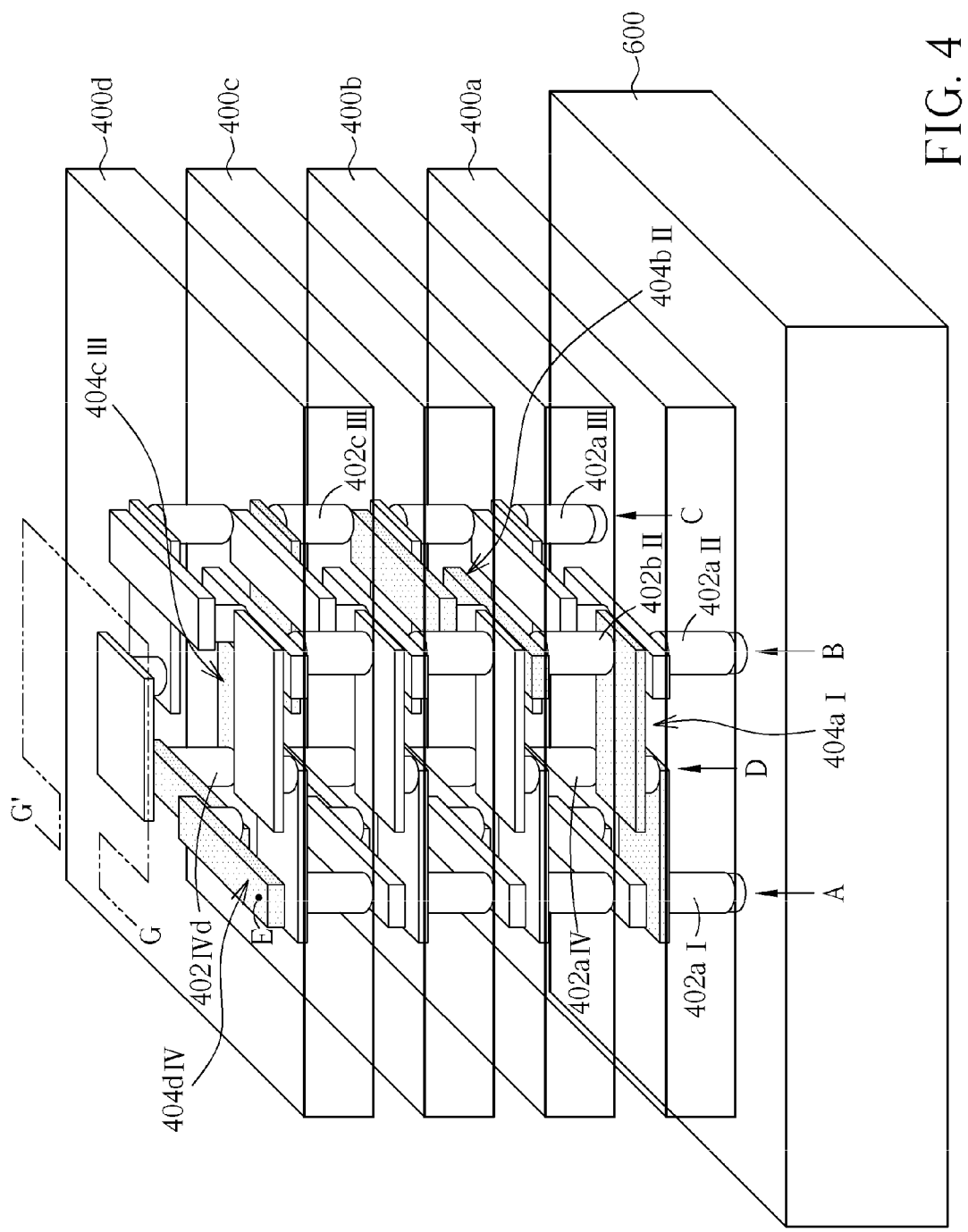
Figure 5:
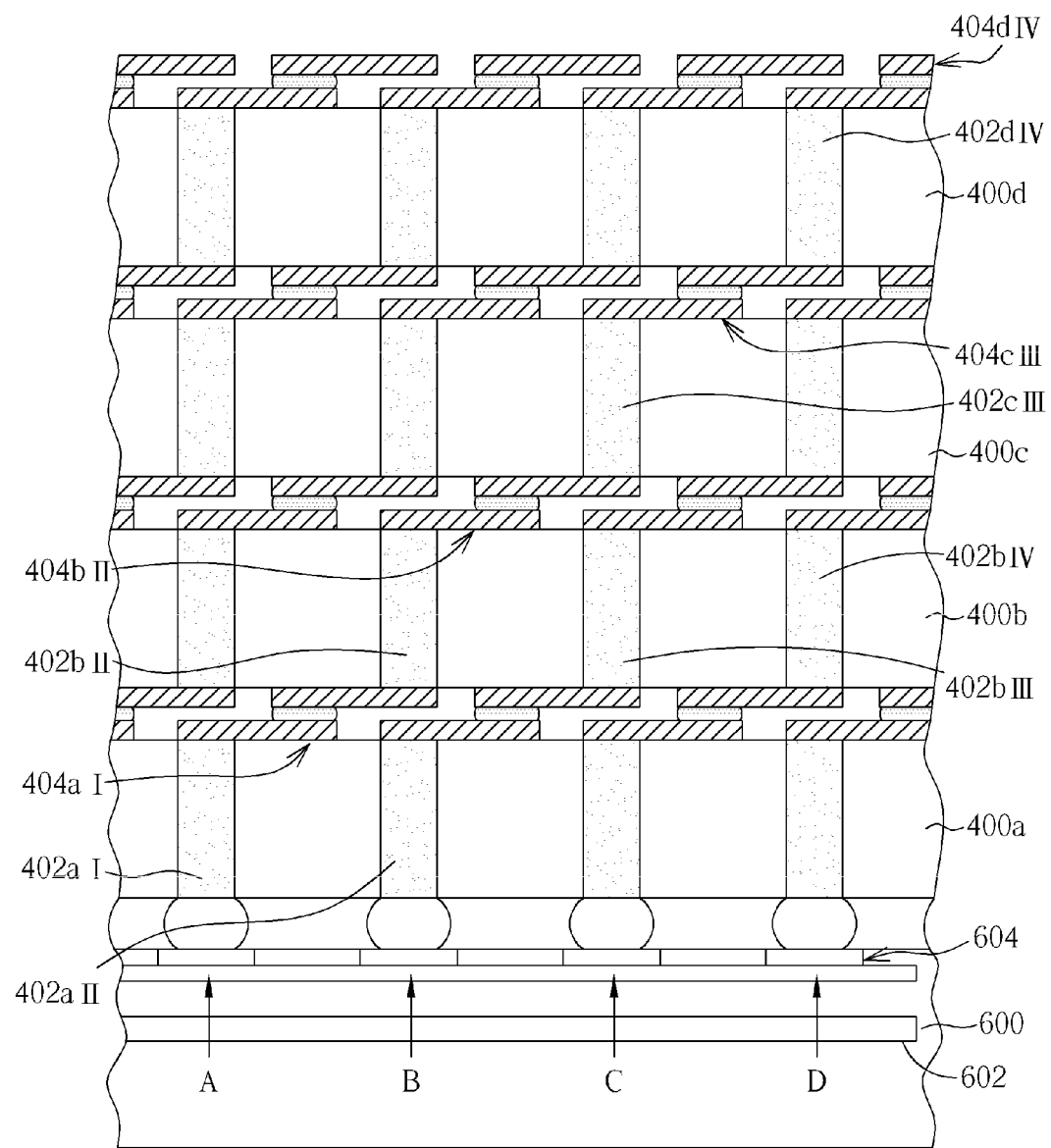

By stacking the same number of chips 400 as the number of the TSVs (in this embodiment, four chips are required), the chip stack package 300 having DNA-like interconnection strands 500 can be constructed. Please refer to FIG. 4 and FIG. 5. FIG. 4 illustrates a three-dimensional schematic diagram of the chip stack package, and FIG. 5 is a cross-sectional schematic diagram taken along line GG' in FIG. 4. As shown in FIG. 4 and FIG. 5, the chip stack package 300 in the present embodiment includes four chips 400a, 400b, 400c and 400d which have substantially identical structure as shown in FIG. 3. The chips 400a, 400b, 400c, and 400d are stacked over a substrate 600, for example, a PCB board provided with an integrated circuit 602 including at least four electrode terminals 604 disposed at the upper surface of the substrate 600. The substrate 600 can provide chip selection signals A, B, C, D for the chips 400a, 400b, 400c, 400d, respectively.

It is one salient feature of this invention that the stacked chips 400 are connected by the TSVs 402 while the TSV 402 in one chip 400 is connected to another TSV 402 in an adjacent chip 400 in a diagonal manner. That is, the TSV 402 in one chip 400 would not connect the vertical corresponding TSV 402 in the adjacent chip 400 but would connect to the relatively diagonal TSV 402 in the adjacent chip 400. For example, the TSV 402aI is connected to the TSV 402bII by the wiring unit 404aI, the TSV 402bII is connected to the TSV 402cIII by the wiring unit 404bII, and TSV 402cIII is connected to the TSV 402dIV by the wiring unit 404cIII. Thus, the TSVs 402aI, 402bII, 402cIII, 402dIV are connected with each other by the wiring units 404aI, 404bII, 404cIII, 404dIV, thereby forming the spiral interconnection strand 500a, as shown in FIG. 2. The interconnection strand 500a is a helix wherein the end of the wiring unit 404IVd (point E in FIG. 4) is in the same vertical position relative to the TSV 402aI. That is, the helix of the interconnection strand 500a goes in "one loop" after traveling from the bottommost chip 400a to the uppermost chip 400d. The interconnection strand 500a, for example, is electrically coupled to the chip selection signal A provided by the substrate 600 to drive the chip 400a, for example. Similarly, chip selection signals B, C, D can be coupled to the chips 400b, 400c, 400d respectively through the interconnection strands 500b, 500c, 500d.

As shown in the 3D diagram of FIG. 4, the TSVs 402 in one chip 400 will form a shape of square from the top view of the chip. For instance, the TSVs 402aI, 402aII, 402aIII and 402aIV in chip 400a form a shape of square. In another embodiment, the TSVs 402 in one chip 400 can form other types of quadrangles. In another embodiment, the TSV 402 in one chip 400 would connect to the TSV 402 in the two next vertical spaces in an adjacent chip 400. For example, the TSV 402aI can connect to the TSV 402bII through the wiring unit 402aI with appropriate configuration.

Figure 6:
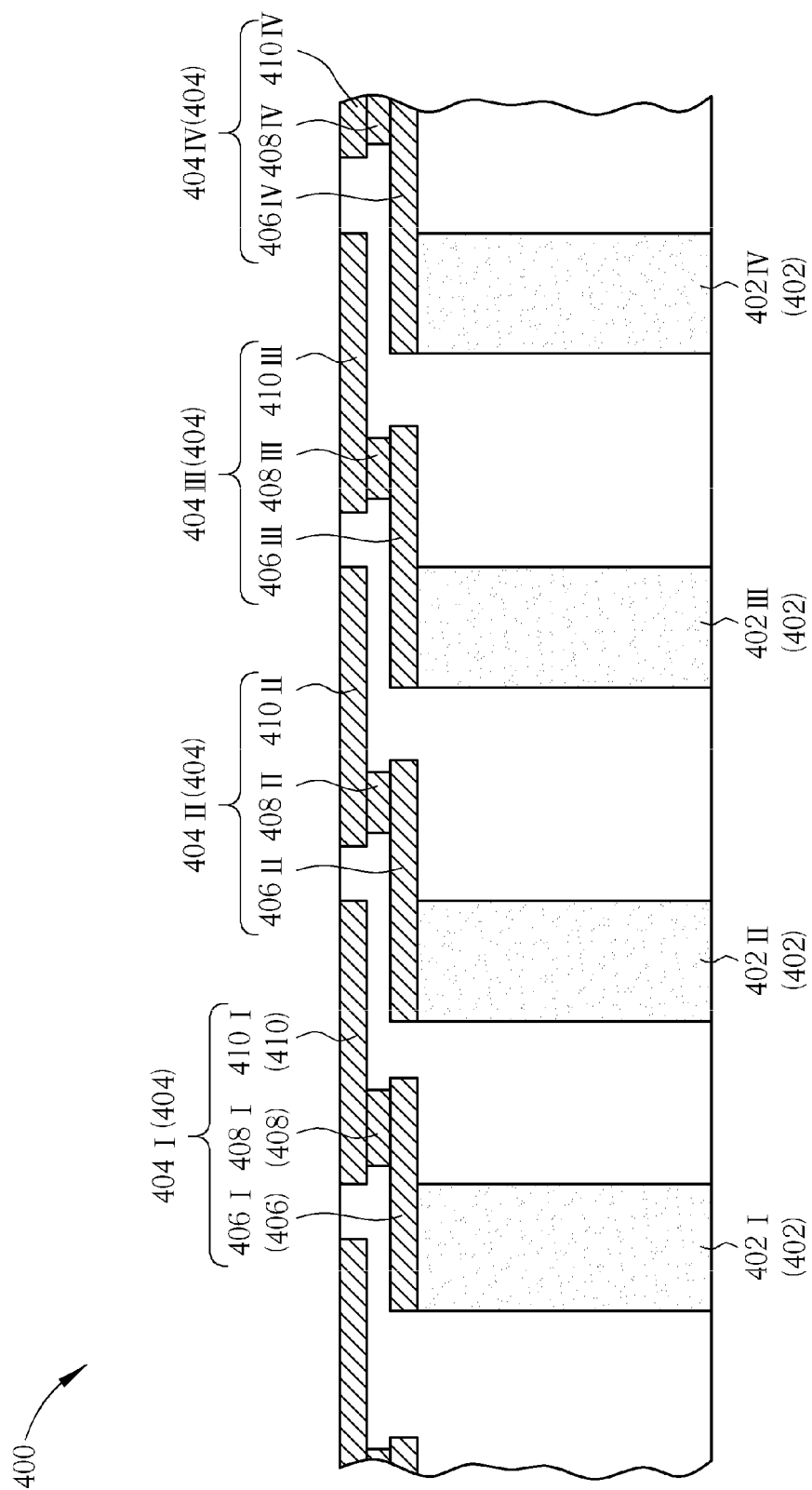
FIG. 6 to FIG. 8 illustrate schematic diagrams of the chip stack package in accordance with the second embodiment in the present invention.
Figure 7:
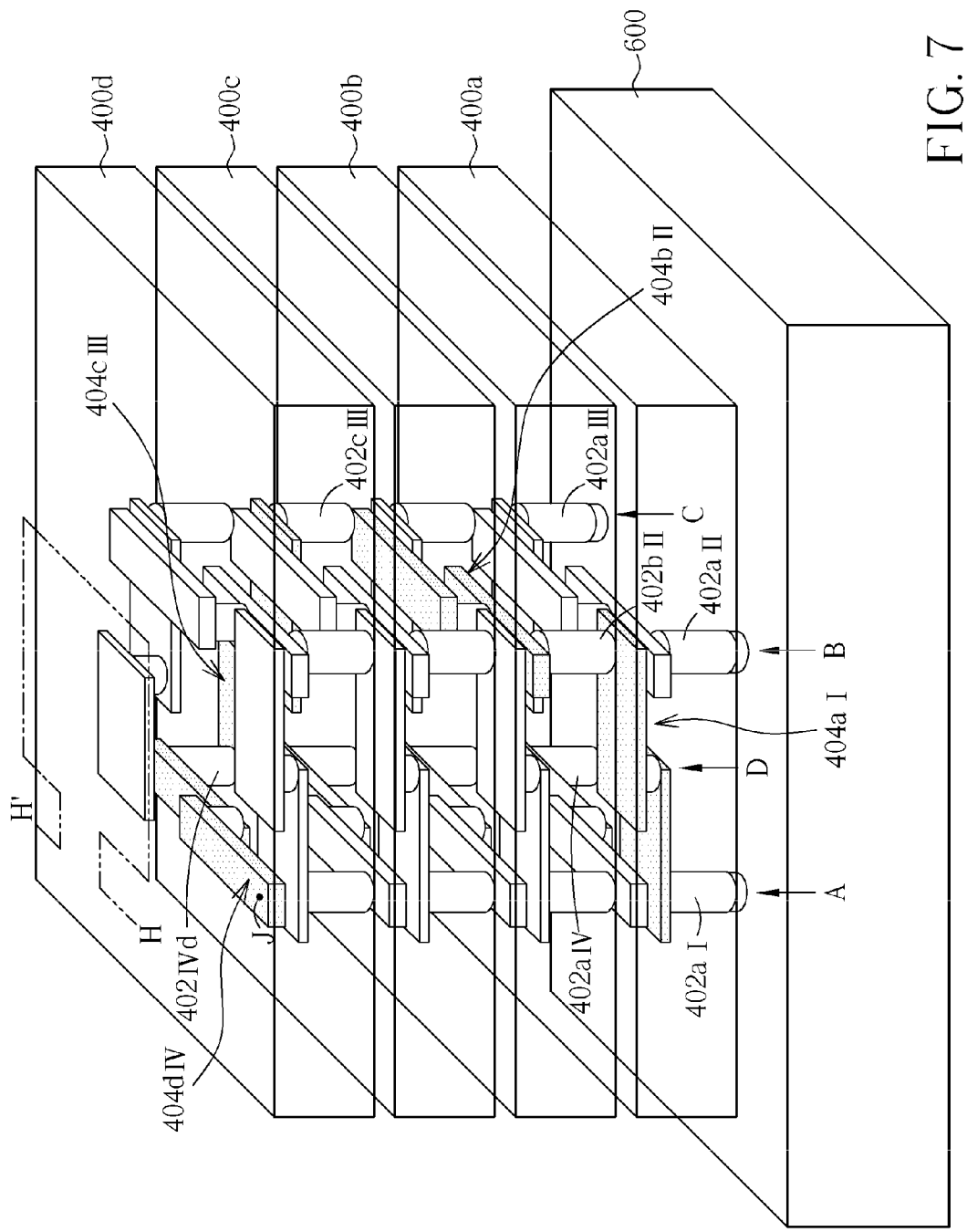
Figure 8:
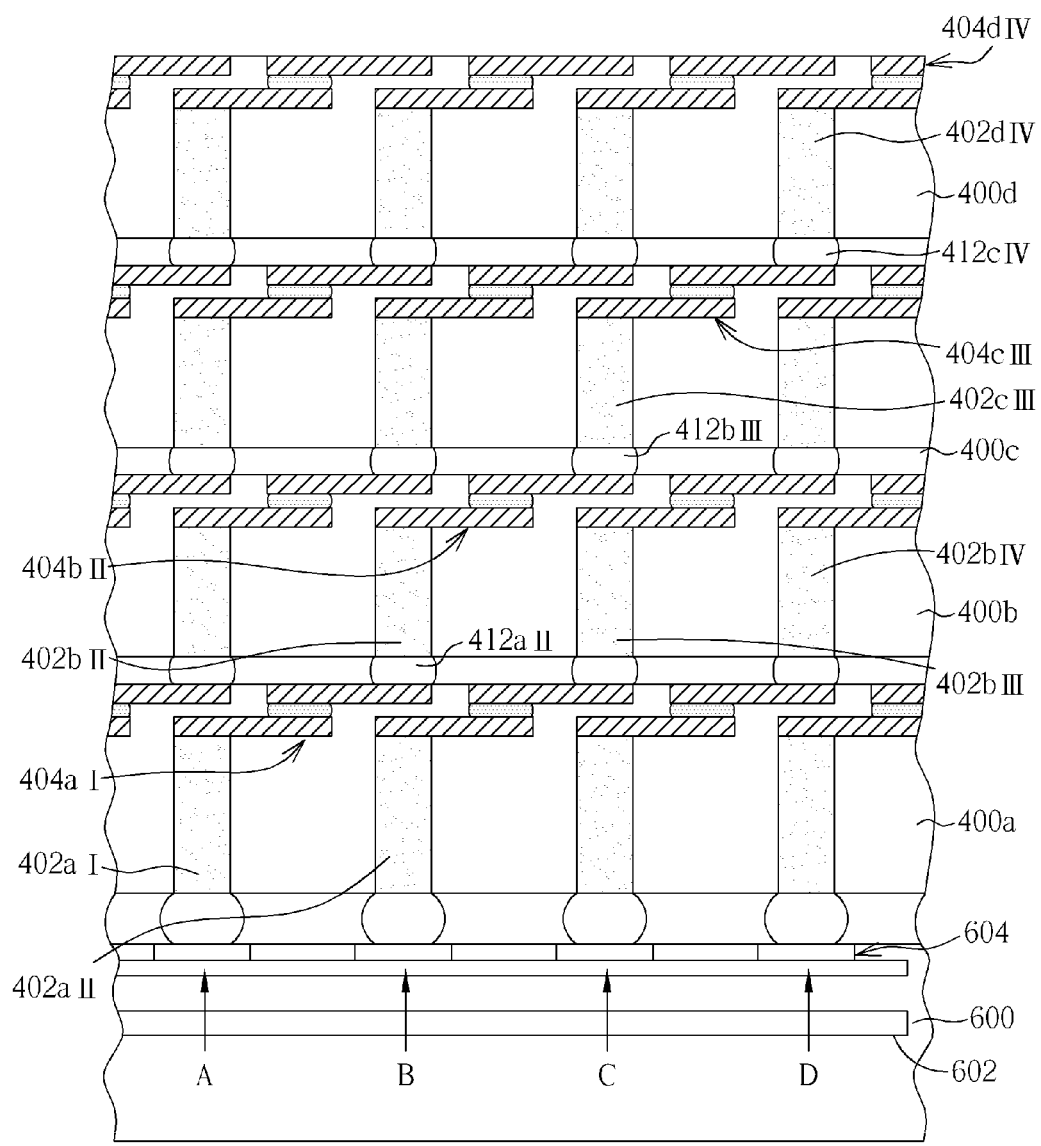

Please refer to FIG. 6 to FIG. 8, illustrating schematic diagrams of the chip stack package in accordance with the second embodiment in the present invention, wherein similar components will be designated similar numerals as in the first embodiment. As shown in FIG. 6, the chip 400 includes four TSVs including TSV 402I, TSV 402II, TSV 402III, TSV 402IV and four wiring units 404I, 404II, 404III, 404IV, all of which are disposed inside the chip 400. The TSVs 404I, 404II, 404III, 404IV are disposed on one side of the chip 400 and the wiring units 404I, 404II, 404III, 404IV are disposed on another side of the chip 400. In the present embodiment, the wiring unit 404 belongs to a metal interconnection system. Each wiring unit 404 includes a bottom layer 406, an interconnection unit 408 and a top layer 410. The bottom layer 406 and the top layer 410, for example, may be two separated metal layers fabricated by conventional semiconductor metallization processes. For instance, the bottom layer 406 may be a metal wiring layer and the top layer 410 can be a pad layer. Each bottom layer 406 is connected to each top layer 410 by the interconnection unit 408 such as a via plug in the present embodiment. In another embodiment, the bottom layer 406 can be directly connected to the top layer 410 without the interconnection unit 408. The TSV 402 is connected to the bottom layer 406 of the wiring unit 404. The wiring unit 404 in the present embodiment is connected to one TSV and is further extending to another TSV which is juxtaposed next to the preceding TSV. Detailed description is similar to that of the first embodiment and is omitted for the sake of simplicity.

By stacking the same number of chips 400 as the number of the TSV (in this embodiment, four chips are required), the chip stack package 300 having DNA-like interconnection strands 500 can be constructed. Please refer to FIG. 7 and FIG. 8. FIG. 7 illustrates a three-dimensional schematic diagram of the chip stack package, and FIG. 8 is a cross-sectional schematic diagram taken along line HH' in FIG. 7. As shown in FIG. 7 and FIG. 8, the chip stack package 300 in the present invention includes four chips 400a, 400b, 400c and 400d which have substantially identical structure as shown in FIG. 6. The chips 400a, 400b, 400c, and 400d are stacked over a substrate 600, for example, a PCB board provided with an integrated circuit 602 including at least four electrode terminals 604 disposed at the upper surface of the substrate 600. The substrate 600 can provide chip selection signals A, B, C, D for the chips 400a, 400b, 400c, 400d, respectively.

The stacked chips 400 are connected by the TSVs 402 while the TSV 402 in one chip 400 is connected to another TSV 402 in an adjacent chip 400 in a diagonal manner. That is, the TSV 402 in one chip 400 would not connect the vertical corresponding TSV 402 in the adjacent chip 400 but would connect to the relatively diagonal TSV 402 in the adjacent chip 400. As shown in FIG. 7 and FIG. 8, the TSV 402aI is connected to the TSV 402bII by the wiring unit 404aI and a solder bump 412aII, the TSV 402bII is connected to the TSV 402cIII by the wiring unit 404bII and a solder bump 412bIII, and TSV 402cIII is connected to the TSV 402dIV by the wiring unit 404cIII and a solder bump 412cIV. Thus, the TSVs 402aI, 402bII, 402cIII, 402dIV are connected with each other by the wiring units 404aI, 404bII, 404cIII, 404dIV, thereby forming the spiral interconnection strand 500a, as shown in FIG. 2. The interconnection strand 500a is a helix wherein the end of the wiring unit 404IVd (point J in FIG. 7) is in the same vertical position relative to the TSV 402aI. That is, the helix of the interconnection strand 500a goes in "one loop" after traveling from the bottommost chip 400a to the uppermost chip 400d. The interconnection strand 500a is coupled to the chip selection signal A provided by the substrate 600 to drive chip 400a, for example. Similarly, the interconnection strands 500b, 500c, 500d are connected to the chip selection signals B, C, D, respectively to select the chips 400b, 400c, 400d.

Figure 9:
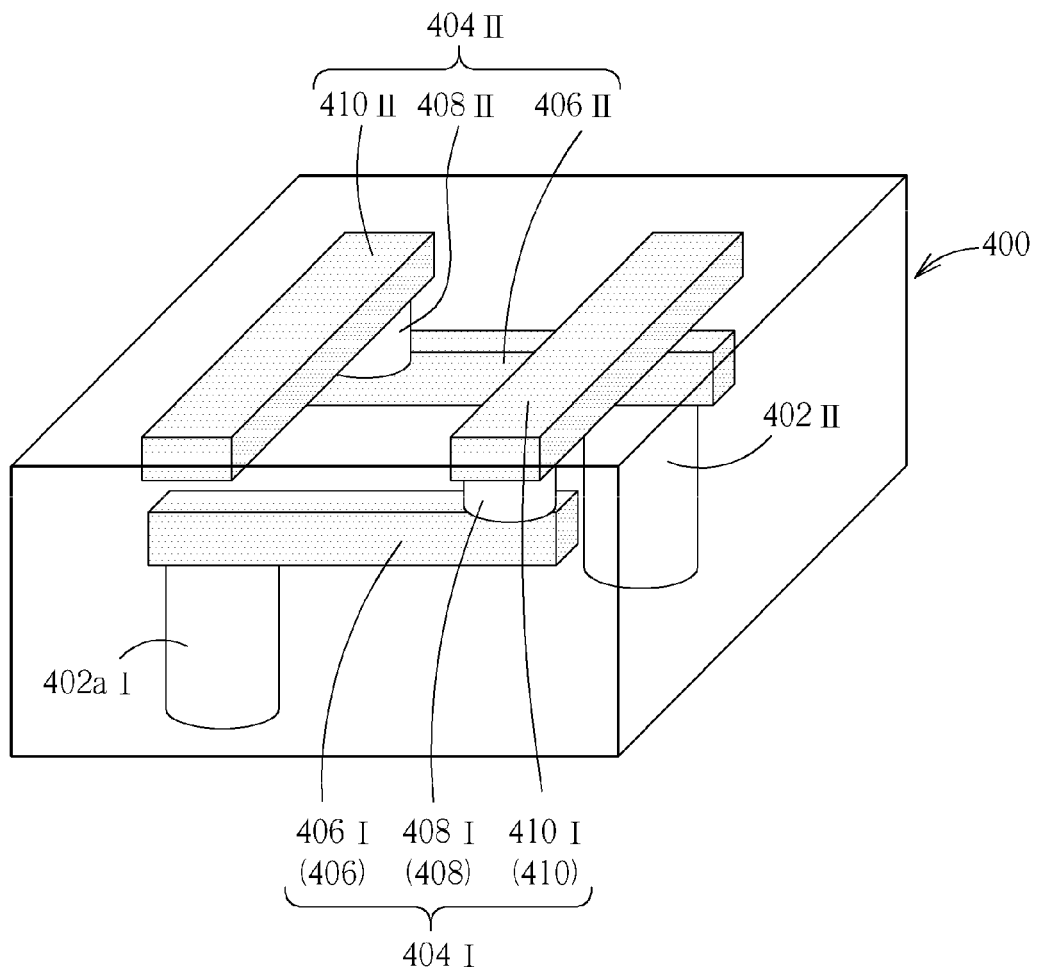
FIG. 9 and FIG. 10 illustrate schematic diagrams of the chip stack package in accordance with the third embodiment in the present invention.
Figure 10:
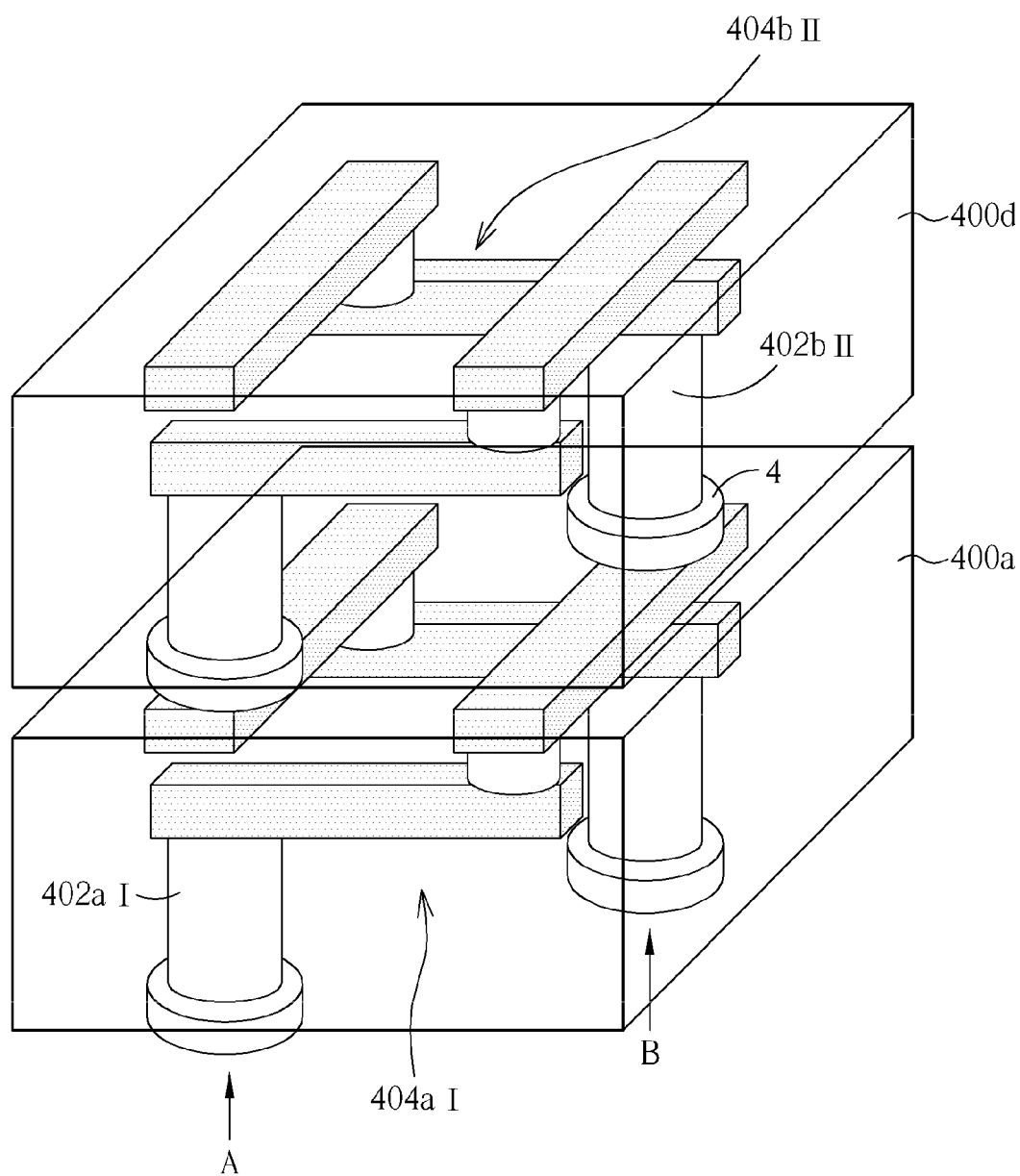

It is noted the number of the interconnection strands 500 is not limited to 4 but can be any number greater than 2. That is, only two chips are required to construct the chip stack package having spiral interconnection strands. Please refer to FIG. 9 and FIG. 10, illustrating schematic diagrams of the chip stack package in accordance with the third embodiment in the present invention. As shown in FIG. 9, the chip 400 includes two TSV 402I and 402II, and two wiring units 404I and 404II. The TSV 402I penetrates from one surface of the chip 400 and is connected to the wiring unit 404I in another surface. The TSV 402II penetrates from one surface of the chip 400 and is connected to the wiring unit 404II in another surface. In one embodiment, the wiring units 404I and 404II may be a metal interconnection system and each of which includes a bottom layer 406, an interconnection unit and a top layer 410. The bottom layer 406 and the top layer 410, for example, may be two individual metal layers while each bottom layer 406 is connected to each top layer 410 by the interconnection unit 408, such as a via plug. In the present embodiment, the bottom layer 406 and the top layer 410 are perpendicular to each other such that the interconnection strand may "turn a corner" at the position of the interconnection unit 410 and further extends to the position above the TSV 402II but does not contact the TSV 402II. As shown in FIG. 10, by stacking two chips 400, the chip stack package having DNA-like interconnection strands 500 can be constructed. The chip stack package in the present embodiment may be similar with the previous embodiments and is not described repeatedly. However, it is noted that a double helix structure is formed in the chip stack package in the present embodiment.

As shown in FIG. 4 and FIG. 7, there are four interconnection strands 500a, 500b, 500c, 500d spirally rotated with each other to form a four-strand helix structure in four chips 400a, 400b, 400c, 400d and as shown in FIG. 10, there are two interconnection strands 500a, 500b spirally rotated with each other to form a double strand helix structure in two chips 400a, 400b. In the present invention, the number of the interconnection strands 500 can be any natural number which is greater than 2. The chip stack package 300 may be applied to n number of chips 400 with n number of interconnection strands 500 wherein each chip 400 includes n number of bottom TSVs 402α, n number of top TSVs 402β, and n number of wiring units 404, thereby forming an n-strand helix structure. The embodiment is featured in that $k^{th}$ bottom TSV 402α is connected to $k+1^{th}$ top TSV 402β, $n^{th}$ bottom TSV 402α is connected to $1^{st}$ top TSV 402β in the chip 400, wherein $1 \le k \le n$ and $n \ge 2$.

Figure 11:
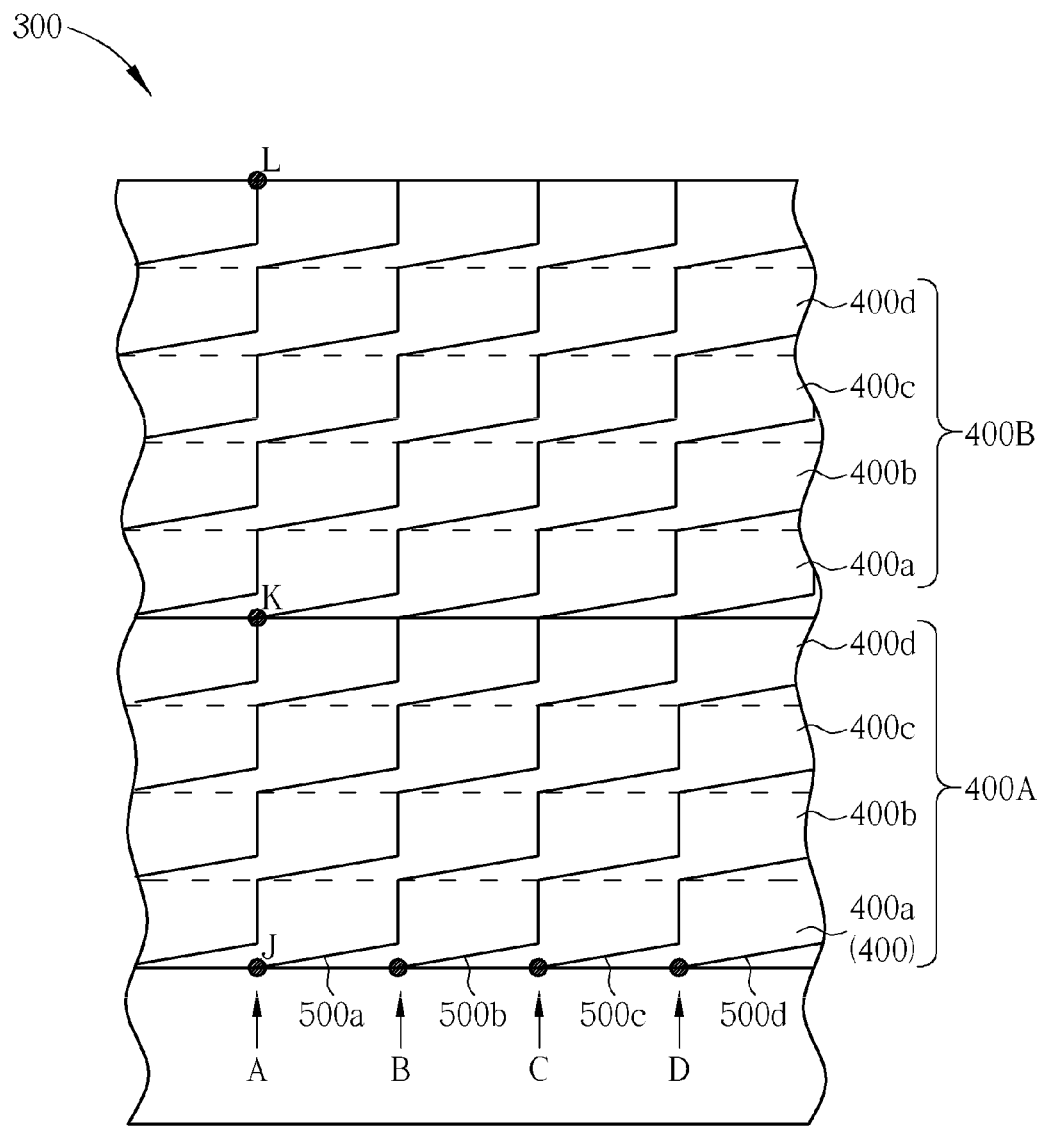
FIG. 11 illustrates a schematic diagram of the chip stack package in accordance with the third embodiment in the present invention.

Please refer to FIG. 11, illustrating a schematic diagram of the chip stack package in accordance with the third embodiment in the present invention. As shown in FIG. 9, the chip stack package 300 in the present invention includes a plurality of sets of chips 400. The term "set" herein refers to a predetermined number (n) of chips 400 having the same number (n) of interconnection strands 500. As shown in FIG. 11, the chip stack package 300 in the present embodiment includes the chip set 400A and the chip set 400B stacked on one another, and both chip set 400A, 400B include chip 400a, 400b, 400c, 400d. There are four interconnection strands 500a, 500b, 500c, 500d connecting the chips 400 in each chip set. Specifically, the interconnection strand 500a rotates a loop within the chip set 400A (from point J to point K) and further rotates another loop within the chip set 400B (from point K to point L). By doing this, the chip selection signal A can be transmitted through the interconnection strand 500a to select the chip 400a in the chip set 400A and the chip 400a in the chip set 400B simultaneously. Accordingly, the chip 400a in the chip set 400A and the chip 400a in the chip set 400B can be selected at the same time when providing the chip selection signal A through the interconnection strand 500a. Similarly, the chip 400b in chip set 400A and the chip 400b in chip set 400B can be selected when providing the chip selection signal B through the interconnection strand 500b. The chip 400c in the chip set 400A and the chip 400c in the chip set 400B can be selected when providing the chip selection signal C through the interconnection strand 500c. The chip 400d in the chip set 400A and the chip 400d in the chip set 400B can be selected when providing the chip selection signal d through the interconnection strand 500d. The sets of the chips 400 can be adjusted according to the design of different products. The more sets the chip stack package 300 includes, the more chips 400 can be driven simultaneously when applying one chip selection signal.

In light of the above, the present invention provides a chip stack package having a predetermined number of chips and interconnection strands. Due to the DNA-like structure of the spiral interconnection strands, the chip selection signal for each chip can be transmitted independently and the space of the chip can be saved. It is noted the spiral interconnection strands are not limited to chip selecting, but can be applied to transmit other signals.

Those skilled in the art will readily observe that numerous modifications and alterations of the device and method may be made while retaining the teachings of the invention.

What is claimed is:

1. A chip stack package, comprising:
an n-number of chips stacked on each other, wherein the n number of chips form a first set of chips;
another n number of chips which forms a second set of chips, wherein the first set of chips is stacked on the second set of chips;
n-number of electrical interconnection strands electrically connecting the chips, wherein the electrical interconnection strands are spirally rotated and insulated from each other.

2. The chip stack package according to claim 1, wherein each of the interconnection strands is electrically coupled to a chip selection signal.

3. The chip stack package according to claim 1, wherein the chips are substantially structurally identical.

4. The chip stack package according to claim 3, wherein each chip comprises n number of TSVs penetrating through the chip, wherein a $k^{th}$ TSV in the chip is connected to a $k+1^{th}$ TSV in an adjacent chip, an $n^{th}$ TSV in the chip is connected to a $1^{st}$ TSV in the adjacent chip, wherein $1 \leq k \leq n$ and $n \geq 2$.

5. The chip stack package according to claim 4, wherein the TSV in one chip and the TSV in another chip are connected by a wiring unit.

6. The chip stack package according to claim 5, wherein the wiring unit comprises a bottom layer and a top layer.

7. The chip stack package according to claim 6, wherein the wiring unit further comprises a connection unit between a bottom layer and a top layer.

8. The chip stack package according to claim 7, wherein the wiring unit comprises an RDL layer.

9. The chip stack package according to claim 8, wherein the connection unit comprises a solder bump.

10. The chip stack package according to claim 7, wherein the wiring unit comprises a metal interconnection system.

11. The chip stack package according to claim 10, wherein the connection unit comprises a via plug and the top layer comprises a pad layer.

12. The chip stack package according to claim 6, wherein each interconnection strand comprises one TSV, one bottom layer, one top layer within one chip.

13. The chip stack package according to claim 1, wherein the first set of chips and the second set of chips are substantially identical.

14. The chip stack package according to claim 13, wherein one chip of the first set of chips and one chip of the second set of chips are electrically coupled to a chip selection signal simultaneously.

* * * * *